(12) United States Patent
Moon (10) Patent No.: US 7,843,219 B2
(45) Date of Patent: Nov. 30, 2010

(54) XOR LOGIC CIRCUIT (75) Inventor: Jin-Yeong Moon, Gyeonggi-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

(21) Appl. No.: 12/345,751

(22) Filed: Dec. 30, 2008

(65) Prior Publication Data
US 2010/0141299 A1 Jun. 10, 2010

(30) Foreign Application Priority Data
Dec. 10, 2008 (KR) ........................ 10-2008-0125262

(51) Int. Cl.
*G06F 7/50* (2006.01)
*H03K 19/21* (2006.01)
(52) U.S. Cl. .................. 326/55; 326/52; 326/54
(58) Field of Classification Search ........ 326/52–55
See application file for complete search history.

(56) References Cited
U.S. PATENT DOCUMENTS
3,683,202 A * 8/1972 Schmidt, Jr. ............ 326/54

5,736,868 A * 4/1998 Kim et al. .................. 326/55

FOREIGN PATENT DOCUMENTS

| JP | 60-206222    | 10/1985 |
| JP | 01-181227    | 7/1989  |
| KR | 1997-0024601 | 5/1997  |
| KR | 1020060001693 A | 1/2006 |

OTHER PUBLICATIONS

Notice of Preliminary Rejection issued from Korean Intellectual Property Office on Jul. 8, 2010.
Notice of Allowance issued from Korean Intellectual Property Office on Oct. 14, 2010.

* cited by examiner

*Primary Examiner*—Anh Q Tran
(74) *Attorney, Agent, or Firm*—IP & T Group LLP (57) ABSTRACT

An XOR logic circuit includes a first transfer unit configured to transfer a logic high level data to an output terminal in response to data applied to first and second input terminals; a multiplexing unit configured to output a power voltage or a ground voltage in response to the data applied to the first and second input terminals; and a second transfer unit configured to transfer a logic low level data to the output terminal in response to an output signal of the multiplexing unit and the data applied to the first and second input terminals.

18 Claims, 5 Drawing Sheets

XOR LOGIC CIRCUIT

CROSS-REFERENCE TO RELATED APPLICATION

The present invention claims priority to Korean patent application number 10-2008-0125262, filed on Dec. 10, 2008, which is incorporated by reference in its entirety.

BACKGROUND OF THE INVENTION

The present invention relates to a semiconductor design technique; and more particularly, to an exclusive OR (XOR) logic circuit for use in a semiconductor memory device.

In general, a logic circuit includes an OR logic circuit, an AND logic circuit, a NOT logic circuit, a NAND logic circuit, a NOR logic circuit and an XOR logic circuit. Since the XOR logic circuit may detect whether a logic level of an input signal is identical to that of the other input signal, the XOR logic circuit is used for a summing circuit, a subtracting circuit and a parity check circuit.

Figure 1:
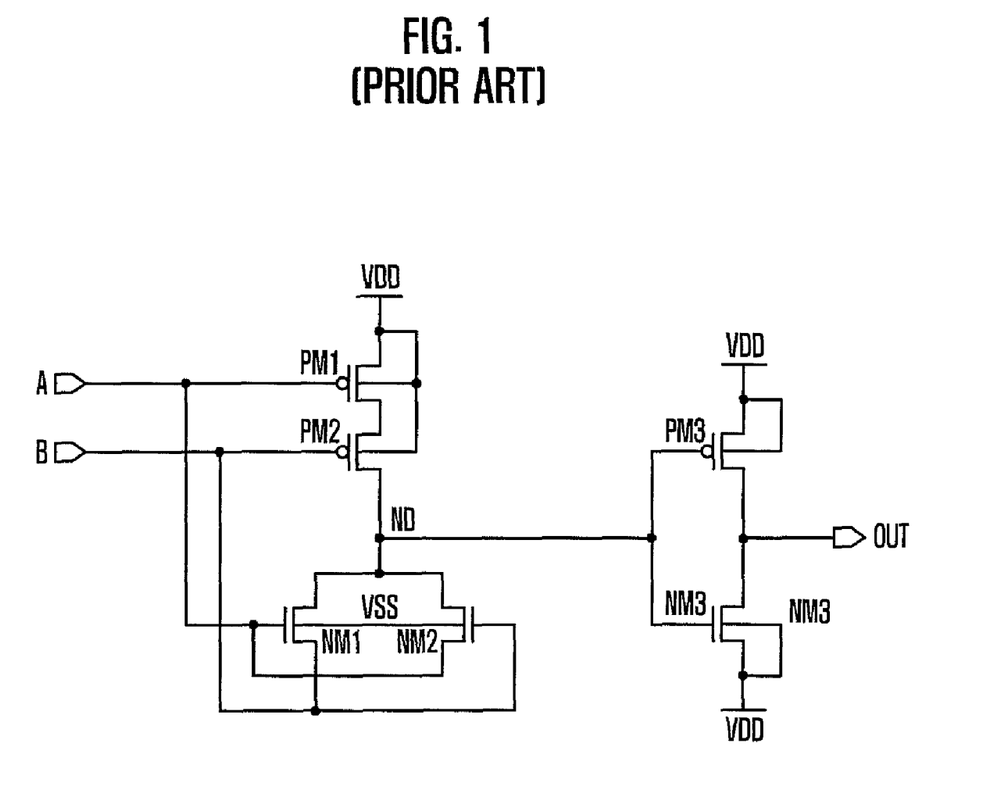
FIG. 1 is a circuit diagram illustrating a conventional XOR logic circuit.

FIG. 1 is a circuit diagram illustrating a conventional XOR logic circuit.

As shown, the XOR logic circuit includes first to third PMOS transistors PM1, PM2 and PM3 and first to third NMOS transistors NM1, NM2 and NM3.

A detailed configuration of the XOR logic circuit will be described hereinafter. A source-drain path of the first PMOS transistor PM1 is coupled between a power voltage VDD terminal and the second PMOS transistor PM2. A gate of the first PMOS transistor PM1 is coupled to a first input terminal A. A source-drain path of the second PMOS transistor PM2 is coupled between a node ND and the first PMOS transistor PM1. A gate of the second PMOS transistor PM2 is coupled to a second input terminal B. A source-drain path of first NMOS transistor NM1 is formed between the node ND and the second input terminal B. A gate of the first NMOS transistor NM1 is coupled to the first input terminal A. A source-drain path of the second NMOS transistor NM2 is formed between the node ND and the first input terminal A. A gate of the second NMOS transistor NM2 is coupled to the second input terminal B. A source-drain path of the third PMOS transistor PM3 is formed between the power voltage VDD and an output terminal OUT. A gate of the third PMOS transistor PM3 is coupled to the node ND. A source-drain path of the third NMOS transistor NM3 is formed between the output terminal OUT and a ground voltage VSS terminal. A gate of the third NMOS transistor NM3 is coupled to the node ND.

The third PMOS transistor PM3 and the third NMOS transistor NM3 perform a buffering operation. A voltage level of the node ND depends on data applied to the first and second input terminals A and B. When the voltage level of the node ND is unstable, a conventional XOR logic circuit needs to perform a buffering operation.

Hereinafter, an operation of the conventional XOR logic circuit will be described in detail. In this example, data of four cases, 00, 01, 10 and 11, is applied to the first and second input terminals A and B, respectively.

First, if a logic low level LOW data is applied to the first and the second input terminals A and B, respectively, the first PMOS transistor PM1 and the second PMOS transistor PM2 are turned on, and the node ND has a voltage level corresponding to the power voltage VDD. Subsequently, the third NMOS transistor NM3 is turned on and the output terminal OUT becomes a logic low level LOW due to the node ND having the high voltage level.

Second, if a logic low level LOW data is applied to the first input terminal A and a logic high level HIGH data is applied to the second input terminal B, the second NMOS transistor NM2 is turned on and the logic low level LOW data applied to the first input terminal A is transferred to the node ND through the second NMOS transistor NM2. Subsequently, the node ND has a voltage level corresponding to the logic low level LOW. And, the third PMOS transistor PM3 is turned on and the output terminal OUT becomes the logic high level HIGH due to the node ND having a low voltage level.

Third, if a logic high level HIGH is applied to the first input terminal A and a logic low level LOW is applied to the second input terminal B, the first NMOS transistor NM1 is turned on and the logic low level data applied to the second input terminal B is transferred to the node ND through the first NMOS transistor NM1. Subsequently, when the node ND has a logic low level, the third PMOS transistor PM3 is turned on and the output terminal OUT becomes a logic high level HIGH.

Figure 2:
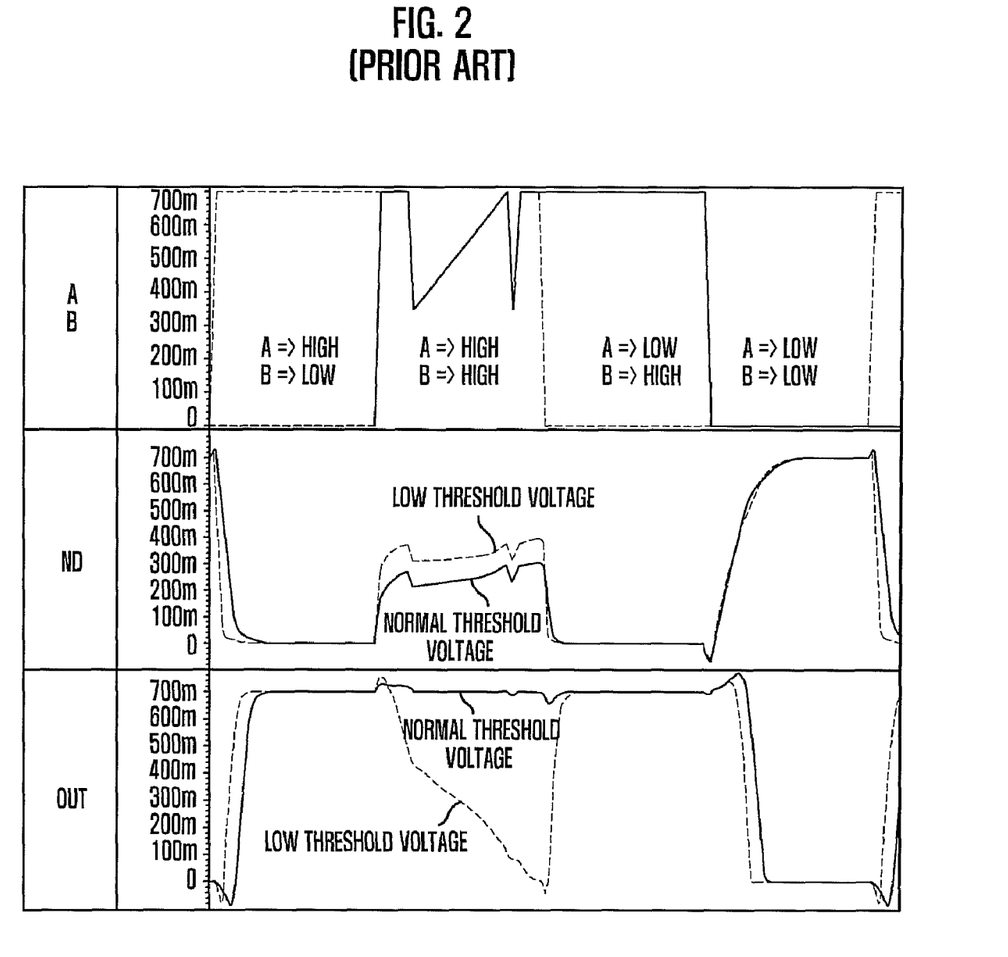
FIG. 2 is a waveform diagram illustrating operational waveforms of the XOR circuit shown in FIG. 1.

Fourth, if a logic high level HIGH data is applied to the first and the second input terminals A and B, respectively the first and second NMOS transistors NM1 and NM2 are turned on and the logic high level data applied to the first and second input terminals A and B are transferred to the data node ND through the first and second NMOS transistors NM1 and NM2. Subsequently, when the node ND has the logic high level, the third NMOS transistor NM3 is turned on and the output terminal OUT becomes a logic low level LOW. FIG. 2 is a waveform diagram illustrating operational waveforms of the XOR circuit shown in FIG. 1. Waveforms of the first and second input terminals A and B, the node ND and the output terminal OUT are shown in FIG. 2.

As shown in FIG. 1, data of four cases may be applied to the first and second input terminals A and B. As shown in FIG. 2, if the logic high level data applied to the first and second input terminals A and B, a noise occurs in the data. When the logic high level data is transferred to the node ND, even if the noise does not occur in the data, a voltage drop caused by a threshold voltage VTH of the first and second NMOS transistors NM1 and NM2 occurs in the node ND.

Furthermore, if the logic high level data is transferred using an NMOS transistor, a loss of the transferred data occurs. If the logic low level data is transferred using the NMOS transistor, a loss of the transferred data does not occur. On the contrary, if the logic high level data is transferred using a PMOS transistor, a loss does not occur in the transferred data. If the logic low level data is transferred, a loss occurs in the transferred data.

That is, if the logic high level HIGH data is applied to the first and second input terminals A and B, the logic high level HIGH data passes through the first and second NMOS transistor NM1 and NM2, and the data having a loss is transferred to the node ND. In other words, the node ND has a voltage level in which a voltage drop occurs from the power voltage VDD corresponding to the logic high level HIGH by the same amount as the threshold value VTH. The voltage level fails to correctly represent a predetermined data. Accordingly, in order to solve this problem, a buffering operation is performed in the node ND and the output terminal OUT obtains an output signal having a full swing between the power voltage VDD and the ground voltage VSS.

However, as shown in FIG. 2, if the noise occurs in the data, even though the buffering operation is performed, the output terminal OUT may not obtain a correct output signal.

First, if the threshold voltage VTH of the first and second NMOS transistors NM1 and NM2 is a normal value, the node ND may not to maintain a predetermined voltage level due to the noise occurring in the data, and the output terminal OUT does not maintain the predetermined output signal as well. In other words, if the logic high level HIGH data is applied to the first and second input terminals A and B, the output terminal OUT must become a logic low level LOW. But, as shown in FIG. 2, because the voltage level value of the node ND is too low, the voltage level of the node ND enables the third PMOS transistor PM3 instead of the third NMOS transistors NM3 to be coupled to the output terminal OUT, and the output terminal OUT becomes a logic high level HIGH.

To solve this problem, a transistor having a low threshold voltage is used. That is, a voltage drop of the node ND is reduced by using the threshold voltage level, which is lower than a normal threshold voltage level. And, the output terminal OUT may have a stable voltage level by using the threshold voltage level that is lower than the normal threshold voltage level. But, this still has an unstable voltage level due to the data having noise.

Figure 3:
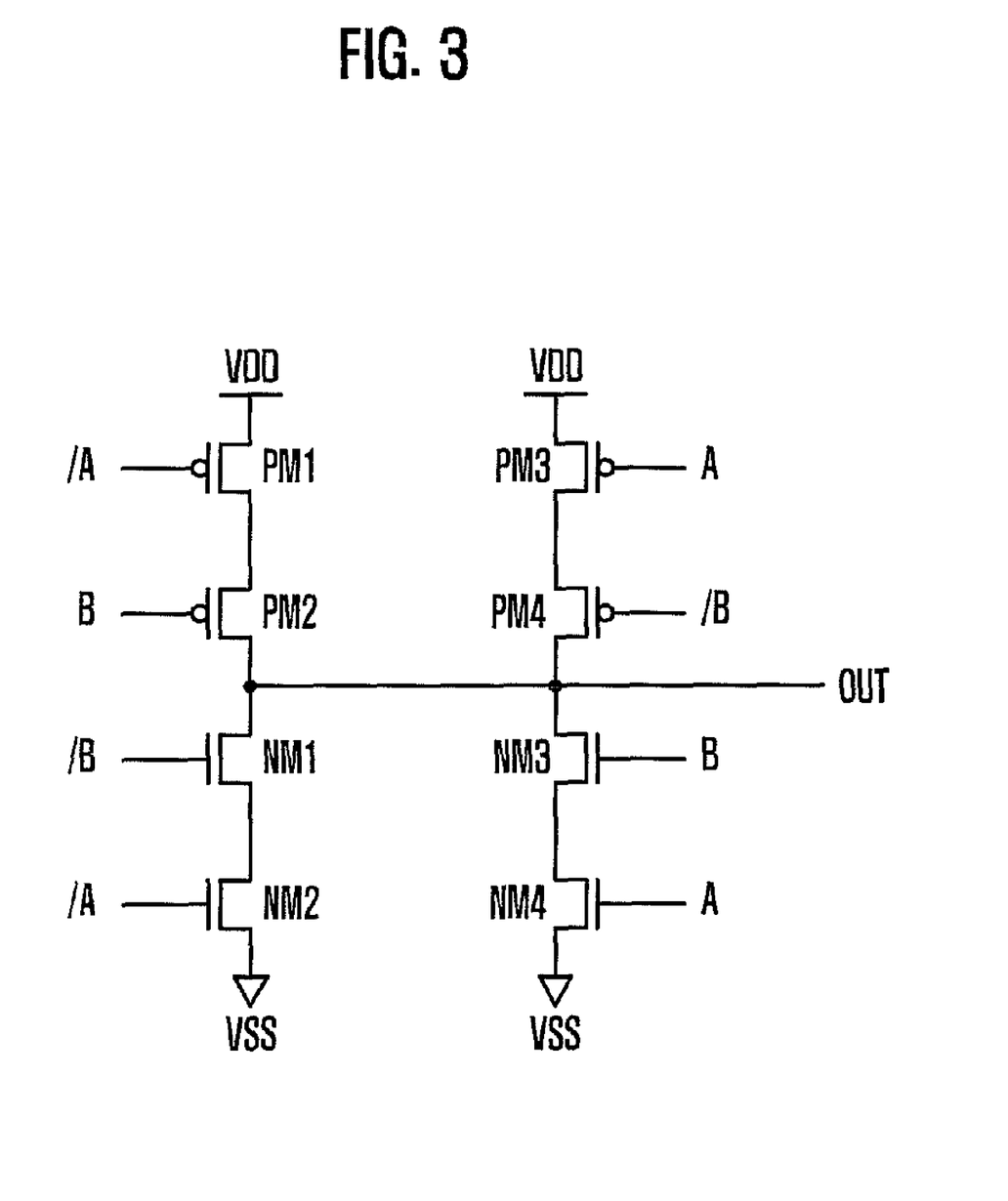
FIG. 3 is a circuit diagram illustrating another conventional XOR logic circuit.

FIG. 3 is a circuit diagram illustrating another conventional XOR logic circuit.

As shown, XOR logic circuit includes a plurality of NMOS transistors NM1, NM2, NM3 and NM4 and a plurality of PMOS transistors PM1, PM2, PM3 and PM4.

A first PMOS transistor PM1 receives an inverted first input signal /A, and a second PMOS transistor PM2 receives a second input signal B. A third PMOS transistor PM3 receives a first input signal A, and a fourth PMOS transistor PM4 receives an inverted second input signal /B. A first NMOS transistor NM1 receives the inverted second input signal /B, and a second NMOS transistor NM2 receives the inverted first input signal /A. A third NMOS transistor NM3 receives the second input signal B, and a fourth NMOS transistor NM4 receives the first input signal A.

In this XOR logic circuit, because a power voltage VDD corresponding to a logic high level data is transferred through only the first to fourth PMOS transistors PM1, PM2, PM3 and PM4, a loss does not occur in the transferred power voltage VDD. Moreover, because the ground voltage VSS corresponding to a logic low level data is transferred through only the first to fourth NMOS transistors NM1, NM2, NM3 and NM4, a loss does not occur in the transferred ground voltage. That is, a buffering operation is performed in the node and the output terminal OUT obtains an output signal having a full swing from the power voltage VDD to the ground voltage without a loss of a threshold voltage VTH in the NMOS transistors and the PMOS transistors.

However, the XOR logic circuit shown in FIG. 3 receives the first input signal A, the inverted first input signal /A, the second input signal B and the inverted second input signal /B. That is, two inverting circuits for inverting the first and second input signals A and B are provided. If it is considered that a general inverting circuit includes one NMOS transistor and one PMOS transistor, the XOR logic circuit shown in FIG. 3 includes 12 transistors of which 4 transistors are used for the inverting circuits. Finally. The XOR logic circuit shown in FIG. 3 uses 6 transistors more than the XOR logic circuit shown in FIG. 1.

Currently, a semiconductor device has proceeded toward a low voltage, a high integration and miniaturization.

In the case of the XOR logic circuit shown in FIG. 1, the total number of transistors is small, but a malfunction may occur due to the input signal of a low voltage level and the loss of the threshold voltage value. In the case of the XOR logic circuit shown in FIG. 3, the loss of the threshold voltage value is small but the XOR logic circuit requires a large number of transistors and occupies a large area of a chip.

SUMMARY OF THE INVENTION

Embodiments of the present invention are directed to providing an XOR logic circuit for performing a full swing of an output signal in response to an input signal.

Embodiments of the present invention are directed to providing an XOR logic circuit for performing a requested logical operation using a minimum number of transistors.

In accordance with an aspect of the present invention, there is provided an XOR logic circuit including a first transfer unit configured to transfer a logic high level data to an output terminal in response to data applied to first and second input terminals, a multiplexing unit configured to output a power voltage or a ground voltage in response to the data applied to the first and second input terminals, and a second transfer unit configured to transfer a logic low level data to the output terminal in response to an output signal of the multiplexing unit and the data applied to the first and second input terminals.

In accordance with another aspect of the present invention, there is provided an XOR logic circuit including a first PMOS transistor configured to have a source-drain path formed between a first input terminal and an output terminal and a gate coupled to a second input terminal, a second PMOS transistor configured to have a source-drain path formed between the second input terminal and the output terminal and a gate coupled to the first input terminal, a first NMOS transistor configured to have a source-drain path formed between the output terminal and the first input terminal and a gate coupled to a common node, a second NMOS transistor configured to have a source-drain path formed between the output terminal and the common node and a gate coupled to the first input terminal, a third PMOS transistor configured to have a source-drain path formed between a power voltage terminal and the common node and a gate coupled to the second input terminal, and a third NMOS transistor configured to have a source-drain path formed between a ground voltage terminal and the common node and a gate coupled to the second input terminal.

The XOR logic circuit in accordance with an embodiment of the present invention prevents a loss of a threshold voltage value produced in a data transmission and minimizes a chip area of a semiconductor device by providing an XOR logic circuit for performing a requested logical operation using a minimum number of transistors.

DESCRIPTION OF SPECIFIC EMBODIMENTS

Hereinafter, an internal generation circuit of a semiconductor memory device in accordance with the present invention will be described in detail with reference to the accompanying drawings.

Figure 4:
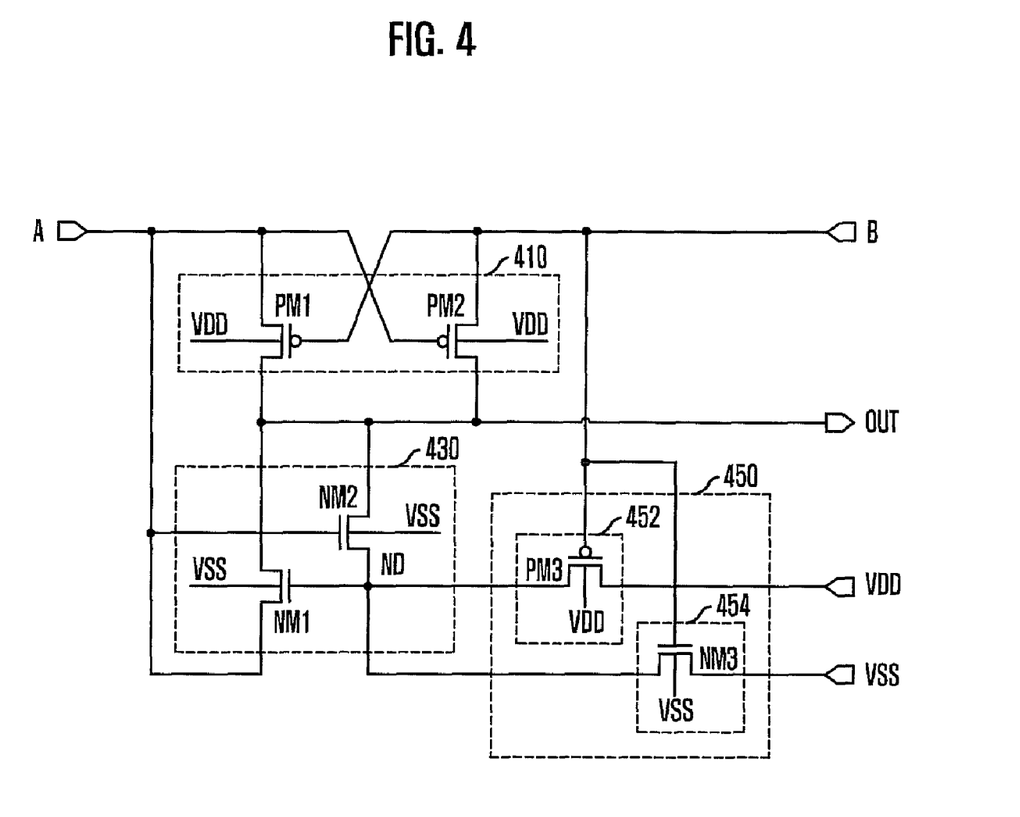
FIG. 4 is a circuit diagram illustrating an XOR logic circuit in accordance with an embodiment of the present invention.

FIG. 4 is a circuit diagram illustrating an XOR logic circuit in accordance with an embodiment of the present invention.

As shown, the XOR logic circuit includes a first transfer unit 410, a second transfer unit 430 and a multiplexing unit 450.

The first transfer unit 410 transfers logic high level data to an output terminal OUT in response to data having a different polarity applied to first and second input terminals A and B. The first transfer unit 410 includes a first PMOS transistor PM1 and a second PMOS transistor PM2.

The first and second PMOS transistors PM1 and PM2 are cross-coupled to each other. That is, the first PMOS transistor PM1 has a source-drain path formed between a first input terminal A and an output terminal OUT and a gate coupled to the second input terminal B. The second PMOS transistor PM2 has a source-drain path formed between the second input terminal B and the output terminal OUT and a gate coupled to the first input terminal A.

The second transfer unit 430 corresponds to the data having the same polarity applied to the first input terminal A and transfers a logic low level data to the output terminal OUT in response to an output signal of the multiplexing unit 450 and the data applied to the first input terminal A. The second transfer unit 430 includes a first NMOS transistor NM1 and a second NMOS transistor NM2. The first NMOS transistor NM1 has a source-drain path formed between the output terminal OUTPUT and the first input terminal A and a gate coupled to a node ND. The second NMOS transistor NM2 has a source-drain path formed between the output terminal OUT and the node ND and a gate coupled to the first input terminal A.

The multiplexing unit 450 outputs a power voltage VDD or a ground voltage VSS in response to the data applied to the second input terminal B and has a first output unit 452 and a second output unit 454.

The first output unit 452 outputs the power voltage VDD to the node ND in response to the data applied to the second input terminal B. The first output unit 452 has a third PMOS transistor PM3 having a source-drain path formed between a power voltage VDD terminal and the node ND and a gate coupled to the second input terminal B.

The second output unit 454 outputs the ground voltage VSS terminal to the node ND in response to the data applied to the second input terminal B. The second output unit 454 has a third NMOS transistor NM3 having a source-drain path formed between the ground voltage VSS terminal and the node ND and a gate coupled to the second input terminal B.

An output signal of the multiplexing unit 450 enables the first NMOS transistor NM1 to be turned on or off. The output signal of the multiplexing unit 450 depends on the data applied to the second input terminal B. That is, the first NMOS transistor NM1 is controlled by the data applied to the second input terminal B.

In case that a main pass for transferring the logic high level data to the output terminal is formed on the first transfer unit 410, a sub pass for performing a sub charging operation which enables the output terminal OUT to be a logic high level HIGH is formed on the second transfer unit 430.

If a main pass for transferring the logic low level data to the output terminal OUT is formed on the second transfer unit 430, a sub pass for performing a sub discharging operation which enables the output terminal OUT to be a logic low level LOW is formed on the first transfer unit 410.

Hereinafter, an operation of the XOR logic circuit will be described below. Data of four cases may be applied to the first and second input terminals A and B, respectively.

First, if a logic low level data is applied to the first and second input terminals A and B, the third PMOS transistor PM3 of the multiplexing unit 450 is turned on in response to the logic low level data applied to the first and second input terminals A and B, and the node ND has a voltage level corresponding to the power voltage VDD. And then, the first NMOS transistor NM1 is turned on in response to the voltage level of the node ND, and the logic low level data applied to the first input terminal A is transferred to the output terminal OUT.

That is, because the logic low level data is transferred through the first NMOS transistor NM1 as the main pass, no loss occurs in the transferred data. Here, the first PMOS transistor PM1 and the second PMOS transistor PM2 are turned on, and transfer the logic low level data as the logic low level data. Accordingly, the sub discharging operation is performed at the output terminal OUT of a logic low level.

Second, if a logic low level data is applied to the first input terminal A and a logic high level data is applied to the second input terminal B, the second PMOS transistor PM2 is turned on in response to the logic low level data applied to the first input terminal A, and the output terminal OUT has a voltage level corresponding to the data applied to the second input terminal B. That is, because the logic high level data is transferred through the second PMOS transistor PM2 as the main pass, no loss occurs in the transferred data. Here, because the third NMOS transistor NM3 is turned on and transfers the ground voltage VSS to the node ND in response to the logic high level data of the second input terminal B, but the second NMOS transistor NM2 is turned off in response to the logic low level data of the first input terminal A, there is no influence on the output terminal OUT.

Third, if a logic high level data is applied to the first input terminal A and a logic low level data is applied to the second input terminal B, the first PMOS transistor PM1 is turned on in response to the logic low level data applied to the second input terminal B, and the output terminal OUT has a voltage level corresponding to the data applied to the first input terminal A.

That is, because the logic high level data is transferred through the first PMOS transistor PM1 as the main pass, no loss occurs in the transferred data. Here, the second NMOS transistor NM2 and the third NMOS transistor NM3 are turned on as the sub pass and transfer the power voltage VDD. Thus, a sub charging operation is performed at the output terminal OUT of a logic high level.

Fourth, if a logic high level data is applied to the first and second input terminals A and B, the second NMOS transistor NM2 and the third NMOS transistor NM3 are turned on in response to the logic high data applied to the first and second input terminals A and B, and the output terminal OUT has a voltage level corresponding to the ground voltage VSS.

That is, because the ground voltage VSS corresponding to the logic low data is transferred through the second and third NMOS transistors NM2 and NM3 as the main pass, no loss occurs in the transferred data. Here, the first and second PMOS transistors PM1 and PM2 are turned off in response to the logic high level data of the first and second input terminals A and B, there is no influence on the output terminal OUT.

Figure 5:
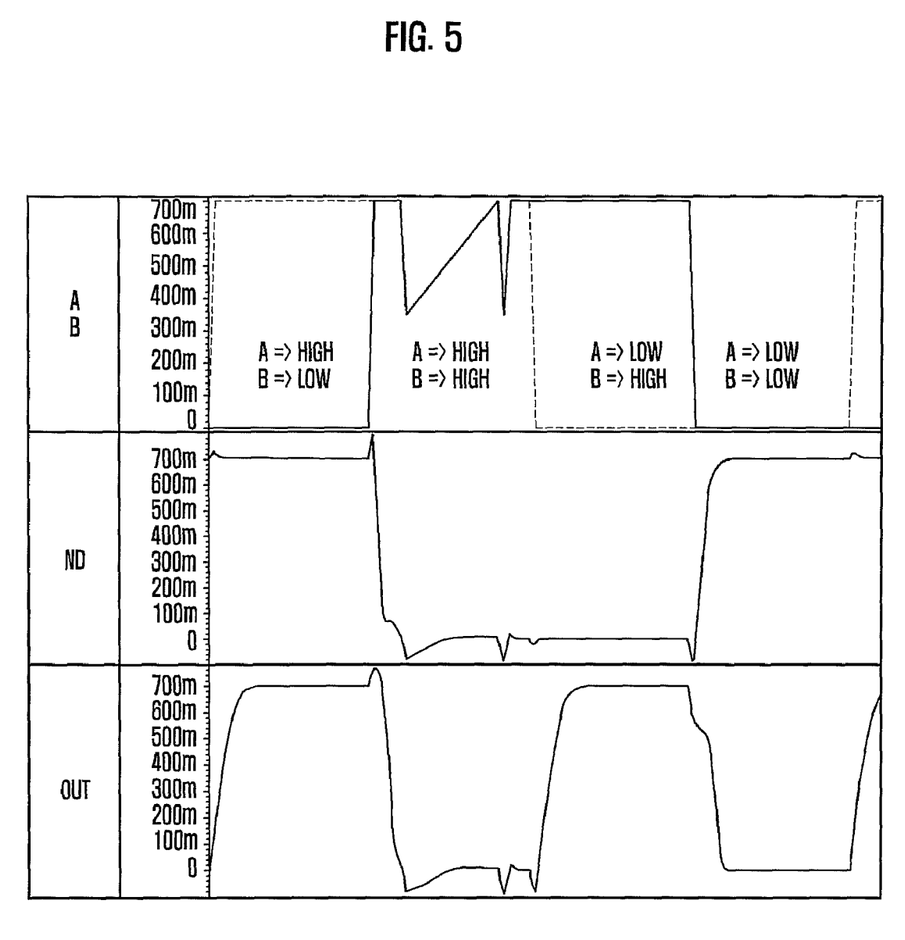
FIG. 5 is a waveform diagram illustrating operation waveforms of the XOR logic circuit shown in FIG. 4.

FIG. 5 is a waveform diagram illustrating operation waveforms of the XOR logic circuit shown in FIG. 4. Waveforms of the first input terminal A, the second input terminal B, the node ND and the output terminal OUT are shown in FIG. 5. For the sake of convenience in the description, the data applied to the first input terminal A and the second input terminal B are identical to the data applied to the first input terminal A and the second input terminal B shown in FIG. 2.

Referring to FIGS. 4 and 5, first, if a logic low level data is applied to the first and second input terminals A and B, the logic low level data is transferred to the output terminal OUT through the first NMOS transistor NM1 as a main pass. Thus, the output terminal OUT becomes a logic low level without data loss.

Second, if a logic low level data is applied to the first input terminal A and a logic high level data is applied to the second input terminal B, the logic high level data is transferred to the output terminal OUT through the second PMOS transistor PM2 as the main pass, and the output terminal becomes a logic high level without data loss.

Third, if a logic high level data is applied to the first input terminal and a logic low level data is applied to the second input terminal, the logic high level data is transferred to the output terminal OUT through the first PMOS transistor PM1 as the main pass, and the output terminal OUT becomes a logic high level without data loss.

Fourth, if a logic high level data is applied to the first and second input terminals A and B, the ground voltage VSS corresponding to the logic low data is transferred to the output terminal OUT through the second and third NMOS transistors NM2 and NM3, and the output terminal OUT becomes a logic low level data.

As mentioned above, in the XOR logic circuit in accordance with an embodiment of the present invention, a data loss does not occur in all cases of the data applied. That is, the data loss is not generated from a threshold voltage value. This indicates that a full swing is performed between the power voltage VDD and the ground voltage VSS at the output terminal.

In other words, the XOR circuit of the present invention performs a stable XOR logic operation for the data applied with six transistors shown in FIG. 4. Because the XOR logic circuit of the present invention uses a minimum number of transistors, it is possible to minimize a chip area of a semiconductor device.

The XOR logic circuit of the present invention may be used for various circuits. Specially, in a Cyclic Redundancy Check (CRC) circuit using a plurality of XOR logic circuits, it is possible to perform a stable operation while reducing chip size.

While the present invention has been described with respect to the specific embodiments, it will be apparent to those skilled in the art that various changes and modifications may be made without departing from the spirit and scope of the invention as defined in following claims.

What is claimed is:

1. An XOR logic circuit, comprising:
   a first transfer unit configured to transfer a logic high level data to an output terminal in response to data applied to first and second input terminals;
   a multiplexing unit configured to output a power voltage or a ground voltage in response to the data applied to the second input terminal; and
   a second transfer unit configured to transfer a logic low level data to the output terminal in response to an output signal of the multiplexing unit and the data applied to the first input terminal.

2. The XOR logic circuit of claim 1, wherein the first transfer unit includes a plurality of MOS transistors that are cross-coupled.

3. The XOR logic circuit of claim 1, wherein the first transfer unit includes:
   a first PMOS transistor configured to have a source-drain path formed between the first input terminal and the output terminal and a gate coupled to the second input terminal; and
   a second PMOS transistor configured to have a source-drain path formed between the second input terminal and the output terminal and a gate coupled to the first input terminal.

4. The XOR logic circuit of claim 1, wherein the multiplexing unit includes:
   a first output unit configured to output the power voltage in response to the data applied to the second input terminal; and
   a second output unit configured to output the ground voltage in response to the data applied to the second input terminal,
   wherein the first and second output units output the power voltage and the ground voltage through a common node, respectively.

5. The XOR logic circuit of claim 4, wherein the first output unit includes:
   a PMOS transistor configured to have a source-drain path coupled between the power voltage terminal and the common node, and a gate coupled to the second input terminal; and
   an NMOS transistor configured to have a source-drain path coupled between the ground voltage terminal and the common node, and a gate coupled to the second input terminal.

6. The XOR logic circuit of claim 1, wherein the second transfer unit includes:
   a first NMOS transistor configured to have a source-drain formed between the output terminal and the first input terminal, and a gate coupled to the output terminal of the multiplexing unit; and
   a second NMOS transistor configured to have a source-drain formed between the output terminal and an output terminal of the multiplexing unit and a gate coupled to the first input terminal.

7. The XOR logic circuit of claim 1, wherein a sub path for performing a sub differential operation for the output terminal is formed on the second transfer unit in response to a main path being formed on the first transfer unit to transfer the logic high level data to the output terminal.

8. The XOR logic circuit of claim 1, wherein a sub path for performing a sub discharging operation for the output terminal is formed on the first transfer unit in response to a main path being formed on the second transfer unit to transfer the logic low level data to the output terminal.

9. The XOR logic circuit of claim 1, wherein the multiplexing unit one of controls the second transfer unit based on the data and applies the logic low level data to the second transfer unit.

10. The XOR logic circuit of claim 1, wherein the first transfer unit is configured to receive the data having a different polarity applied to the first and second input terminals, and the second transfer unit is configured to receive the data having the same polarity applied to the first and second input terminals.

11. An XOR logic circuit, comprising:
   a first PMOS transistor configured to have a source-drain path formed between a first input terminal and an output terminal and a gate coupled to a second input terminal;
   a second PMOS transistor configured to have a source-drain path formed between the second input terminal and the output terminal and a gate coupled to the first input terminal;

a first NMOS transistor configured to have a source-drain path formed between the output terminal and the first input terminal and a gate coupled to a common node;

a second NMOS transistor configured to have a source-drain path formed between the output terminal and the common node and a gate coupled to the first input terminal;

a third PMOS transistor configured to have a source-drain path formed between a power voltage terminal and the common node and a gate coupled to the second input terminal; and a third NMOS transistor configured to have a source-drain path formed between a ground voltage terminal and the common node and a gate coupled to the second input terminal.

12. The XOR logic circuit of claim 11, wherein the first PMOS transistor has a main path for transferring the logic high level data to the output terminal in response to a logic high level data being applied to the first input terminal and a logic low level data being applied to the second input terminal.

13. The XOR logic circuit of claim 11, wherein the second NMOS transistor and the third PMOS transistor have a sub path for performing a sub charging operation at the output terminal in response to a logic high level data being applied to the first input terminal and a logic low level data being applied to the second input terminal.

14. The XOR logic circuit of claim 11, wherein the second PMOS transistor has a main path for transferring the logic high level data to the output terminal in response to a logic low level data being applied to the first input terminal and a logic high level data being applied to the second input terminal.

15. The XOR logic circuit of claim 11, wherein the first NMOS transistor has a main path for transferring the logic low level data to the output terminal in response to a logic low level data being applied to the first input terminal and a logic low level data being applied to the second input terminal.

16. The XOR logic circuit of claim 11, wherein the first PMOS transistor and the second PMOS transistor have a sub path for performing a sub discharging operation at the output terminal in response to a logic low level data being applied to the first input terminal and a logic low level data being applied to the second input terminal.

17. The XOR logic circuit of claim 11, wherein the second NMOS transistor and the third NMOS transistor have a main path for transferring the logic low level data to the output terminal in response to a logic high level data being applied to the first input terminal and a logic high level data being applied to the second input terminal.

18. The XOR logic circuit of claim 11, wherein the first NMOS transistor is controlled by the data applied to the second input terminal.

* * * * *